(12) United States Patent
Chen et al.

(10) Patent No.: US 12,004,325 B2
(45) Date of Patent: Jun. 4, 2024

(54) IMMERSION LIQUID COOLING TANK ASSEMBLY WITH FAN

(71) Applicant: Quanta Computer Inc., Taoyuan (TW)

(72) Inventors: Chao-Jung Chen, Taoyuan (TW); Yu-Nien Huang, Taoyuan (TW); Chang-Yu Chiang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 258 days.

(21) Appl. No.: 17/654,115

(22) Filed: Mar. 9, 2022

(65) Prior Publication Data

US 2023/0262930 A1 Aug. 17, 2023

Related U.S. Application Data

(60) Provisional application No. 63/268,048, filed on Feb. 15, 2022.

(51) Int. Cl.
*H05K 7/20* (2006.01)

(52) U.S. Cl.
CPC ......... *H05K 7/203* (2013.01); *H05K 7/20318* (2013.01); *H05K 7/20381* (2013.01); *H05K 7/20818* (2013.01)

(58) Field of Classification Search
CPC ............................. H05K 7/203; H05K 7/20318
See application file for complete search history.

(56) References Cited

U.S. PATENT DOCUMENTS

| 5,823,248 | A | * | 10/1998 | Kadota | ................. | F25B 23/006 |
| | | | | | | 165/104.33 |
| 7,463,487 | B2 | * | 12/2008 | Kim | ................... | H05K 7/20972 |
| | | | | | | 345/905 |
| 11,536,290 | B2 | * | 12/2022 | Li | .......................... | F24F 1/0011 |
| 2009/0113915 | A1 | * | 5/2009 | Kim | ....................... | F24F 1/0033 |
| | | | | | | 62/515 |
| 2011/0007109 | A1 | * | 1/2011 | Shields | .................. | B41J 29/377 |
| | | | | | | 347/18 |
| 2020/0315060 | A1 | * | 10/2020 | Chen | ................... | H05K 7/20236 |
| 2021/0219454 | A1 | * | 7/2021 | Cheng | ................ | H05K 7/20818 |

\* cited by examiner

*Primary Examiner* — Robert J Hoffberg
(74) *Attorney, Agent, or Firm* — NIXON PEABODY LLP

(57) ABSTRACT

An immersion liquid cooling tank assembly includes a tank, a condenser, at least one cross-flow fan, an internal wall system, a top cover, and at least one sloping wall. The tank includes a base and at least one sidewall. The base is connected to the sidewall. The condenser is located within the tank. The condenser is adapted to transform vapor into liquid. The cross-flow fan is near the condenser. The cross-flow fan produces an airflow. The internal wall system is located adjacent to the cross-flow fan to assist in directing the airflow from the cross-flow fan. The top cover is located generally opposite to the base. The sloping wall is located between the top cover and the sidewall. The sloping wall provides a closed airflow loop for the airflow produced by the cross-flow fan.

19 Claims, 2 Drawing Sheets

IMMERSION LIQUID COOLING TANK ASSEMBLY WITH FAN

CROSS REFERENCE TO RELATED APPLICATIONS

This application claims priority to and the benefits of U.S. Provisional Patent No. 63/268,048 filed on Feb. 15, 2022, titled "Internal Flow Field Cooling with Coanda Effect", the contents of which are hereby incorporated by reference herein in their entirety.

FIELD OF THE INVENTION

The present invention relates generally to cooling systems, and more specifically, to tank assemblies that assist in cooling heat-generating components, such as those in servers.

BACKGROUND OF THE INVENTION

Computer components, such as servers, include numerous electronic components that are powered by a common power supply. Servers generate an enormous amount of heat due to the operation of internal electronic devices such as controllers, processors, memory, and the like. Overheating from the inefficient removal of such heat has the potential to shut down or impede the operation of such devices. Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components.

Liquid cooling is the currently accepted solution for rapid heat removal due to the superior thermal performance from liquid cooling. Liquid cooling is more effective in absorbing and transporting heat from the heat-generating components, and allows heat removal without noise pollution. In an immersion liquid cooling system, heat-generating components, such as servers, switches, and storage devices, will be immersed in a tank-holding coolant.

Thus, there is a need for an immersion liquid cooling tank assembly that efficiently removes a great amount of heat from the heat-generating components.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, an immersion liquid cooling tank assembly comprises a tank, a condenser, at least one cross-flow fan, an internal wall system, a top cover, and at least one sloping wall. The tank includes a base and at least one sidewall. The base is connected to the at least one sidewall. The condenser is located within the tank. The condenser is adapted to transform vapor into liquid. The at least one cross-flow fan is near the condenser. The at least one cross-flow fan produces an airflow. The internal wall system is located adjacent to the at least one cross-flow fan to assist in directing the airflow from the cross-flow fan. The top cover is located generally opposite to the base. The at least one sloping wall is located between the top cover and the least one sidewall. The at least one sloping wall provides a closed airflow loop for the airflow produced by the at least one cross-flow fan.

According to a configuration of the above implementation, the at least one sidewall is a plurality of sidewalls.

According to another configuration of the above implementation, the at least one cross-flow fan is a plurality of cross-flow fans. In a further aspect, the tank assembly further includes a partition located between the plurality of cross-flow fans.

According to a further configuration of the above implementation, the internal wall system includes a plurality of walls.

In a further aspect of the above implementation, the tank assembly further includes a coolant located and contained within the tank. The coolant in one embodiment is a fluorocarbon. In another embodiment, the coolant is water or a mixture including water.

In a further aspect of the above implementation, the tank assembly further includes a plurality of heat-generating components contained within the tank. In one embodiment, the plurality of heat-generating components includes storage servers, application servers, switches, or other electronic devices.

In yet a further aspect of the above implementation, the at least one sloping wall slopes inwardly at an angle of from about 10 to about 80 degrees as measured from the at least one sidewall. In another embodiment, the at least one sloping wall slopes inwardly at an angle of from about 20 to about 70 degrees as measured from the at least one sidewall.

According to a further aspect of the present disclosure, an immersion liquid cooling tank assembly comprises a tank, a condenser, at least one cross-flow fan, an internal wall system, a top cover, at least one sloping wall, a coolant, and a plurality of hear-generating components. The tank includes a base and at least one sidewall. The base is connected to the at least one sidewall. The base is generally perpendicular to the at least one sidewall. The condenser is located within the tank. The internal wall system is located adjacent to the at least one cross-flow fan to assist in directing the airflow from the at least one cross-flow fan. The top cover is located generally opposite to the base. The base is generally perpendicular to the at least one sidewall. The at least one sloping wall is connected to the top cover and the least one sidewall. The at least one sloping wall is generally diagonal relative to the top cover and the at least one sidewall. The coolant is contained within the tank. The plurality of heat-generating components is contained within the tank.

According to a configuration of the above implementation, the coolant is a fluorocarbon in one embodiment. In another embodiment, the coolant is water or a mixture including water.

According to a further aspect of the present disclosure, the plurality of heat-generating components includes one or more of: storage servers, application servers, switches, and other electronic devices.

According to a configuration of the above implementation, the at least one sloping wall slopes inwardly at an angle of from about 10 to about 80 degrees as measured from the at least one sidewall. In another embodiment, the at least one sloping wall slopes inwardly at an angle of from about 20 to about 70 degrees as measured from the at least one sidewall.

According to a configuration of the above implementation, the internal wall system includes a plurality of walls.

According to a further aspect of the present disclosure, the at least one cross-flow fan is a plurality of cross-flow fans.

According to a further aspect of the present disclosure, an immersion liquid cooling tank assembly comprises a tank, a condenser, at least one cross-flow fan, an internal wall system, a top cover, and at least one sloping wall. The tank includes a base and at least one sidewall. The base is connected to the at least one sidewall. The condenser is located within the tank. The condenser is adapted to transform vapor into liquid. The at least one cross-flow fan is near the condenser. The at least one cross-flow fan produces an airflow. The internal wall system is located adjacent to the at least one cross-flow fan to assist in directing the airflow from the cross-flow fan. The top cover is located generally opposite to the base. The least one sidewall provides a closed airflow loop for the airflow produced by the at least one cross-flow fan.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

Figure 1:
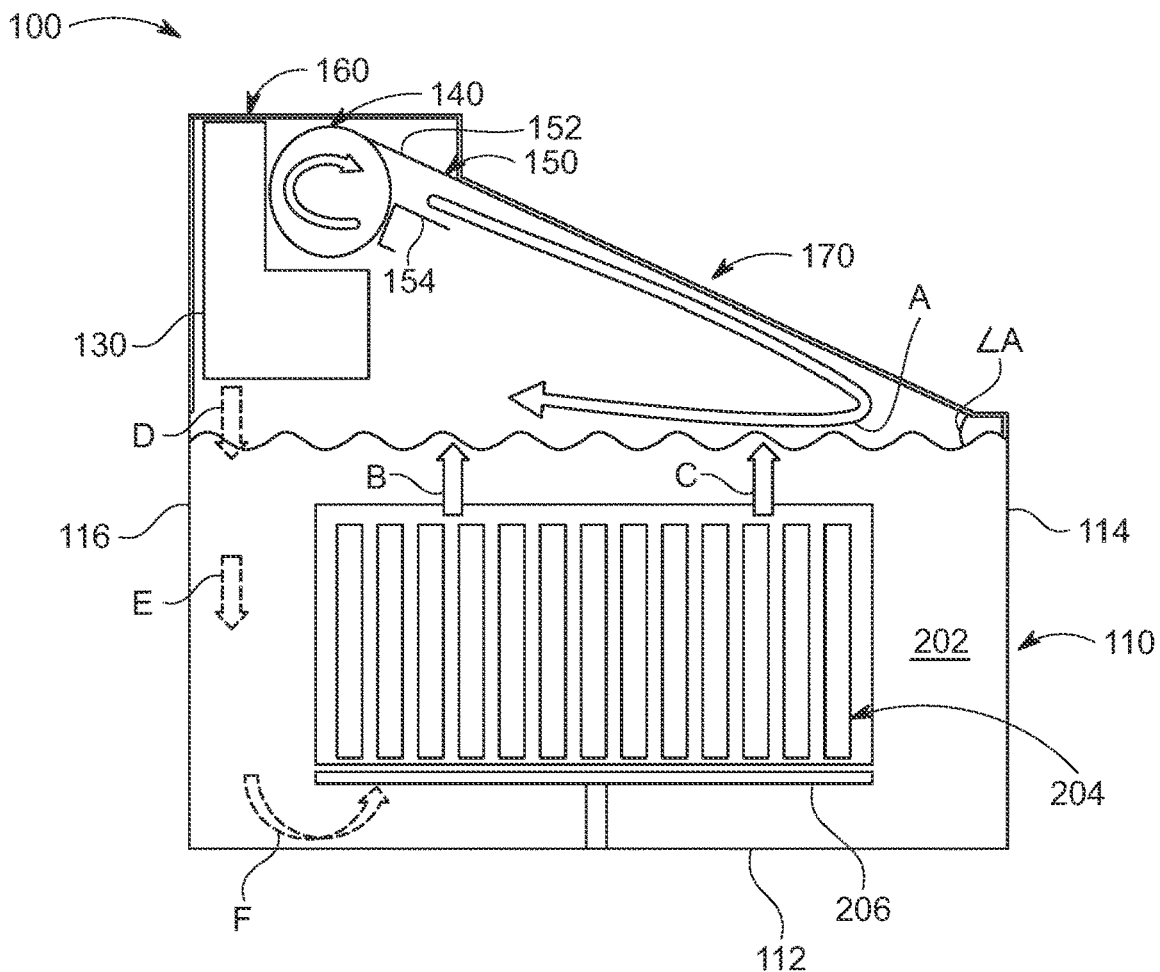
FIG. 1 is a semi-transparent, front view of an immersion liquid cooling tank assembly, in accordance with one embodiment of the present disclosure.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
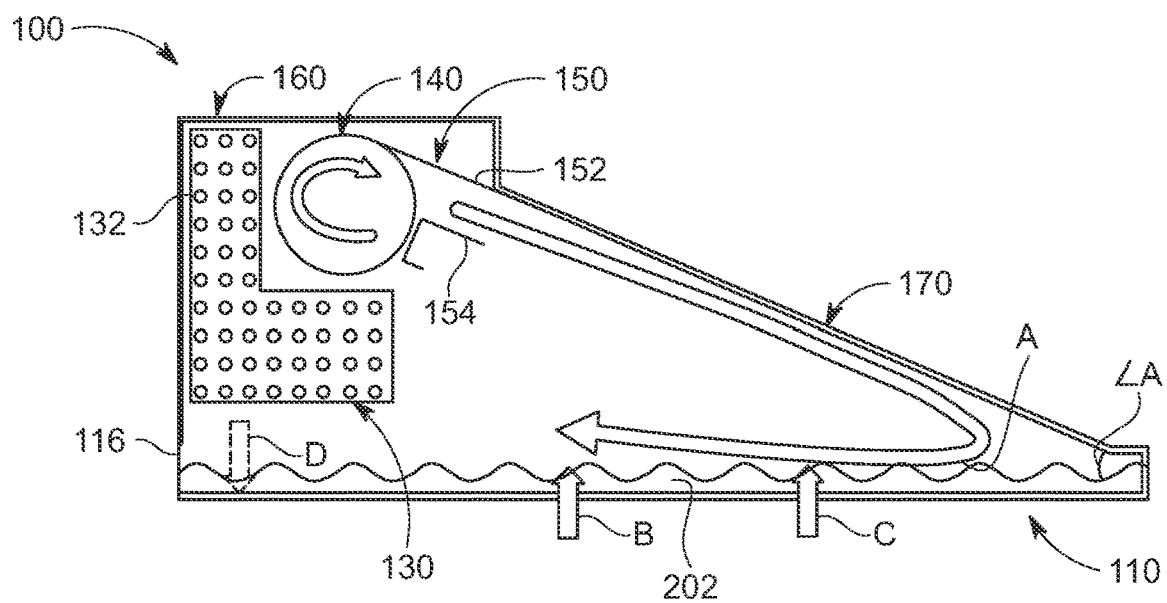
FIG. 2 is an enlarged semi-transparent, front view of a portion of the immersion liquid cooling tank assembly of FIG. 1.

FIG. 1 is a semi-transparent, front view of an immersion liquid cooling tank assembly 100, according to one embodiment of the present disclosure. FIG. 2 is an enlarged semi-transparent, front view of a portion of the immersion liquid cooling tank assembly 100. The immersion liquid cooling tank assembly 100 is configured to contain and cool heat-generating components, as will be discussed below. Non-limiting examples of heat-generating components that may be contained within the immersion liquid cooling tank assembly include, but are not limited to, storage servers, application servers, switches, and other electronic devices. Examples include, but are not limited to, central processing units (CPU), dual in-line memory modules (DIMM), network cards, a hard disk drives (HDD), solid state drives (SSD), graphics processing units (GPU) or field programmable gate arrays (FPGA). It is contemplated that other heat-generating components may be contained within the immersion liquid cooling tank assembly.

Referring to FIGS. 1 and 2, the immersion liquid cooling tank assembly 100 includes a tank 110, a condenser 130, a cross-flow fan 140, an internal wall system 150, a top cover 160 and a sloping wall 170. The tank 110 includes a base 112, and a plurality of sidewalls 114, 116. The other sidewalls of the immersion liquid cooling tank assembly 100 are not shown in FIGS. 1 and 2. The base 112 and the plurality of sidewalls including sidewalls 114, 116 are connected or attached with each other. In some embodiments/implementations, the base and the plurality of sidewalls may be integrally connected. In other embodiments, the base and the plurality of sidewalls may be formed separately and securely attached together.

A portion of the tank 110 is rectangular. It is contemplated that the tank may be other polygonal shapes such as hexagonal. It is also contemplated that the tank may include at least one sidewall that extends continuously around such as a generally oval or generally circular tank. Thus, the tank in such an embodiment may be a non-polygonal shape. It is contemplated that the tank may be of other non-polygonal shapes. It is contemplated that if there is a plurality of sidewalls, the sidewalls may be of different shapes or sizes.

Referring still to FIG. 2, the immersion liquid cooling tank assembly 100 includes the condenser 130 with an internal network of fluid conduits. The fluid conduits used in the condenser 130 are in the form of condenser tubes 132 in one embodiment. The plurality of condenser tubes 132 used in the condenser 130 is desirable because of their efficiency in the cooling of the coolant from its vapor phase to its liquid phase, as will be discussed below.

The plurality of condenser tubes 132 used in the condenser 130 may extend between opposing ends of a manifold system (not shown). The condenser tubes 132 may include fins and surface treatment to assist in making the condensed coolant or liquid fall back down and recycle. One non-limiting manifold system may include the plurality of condenser tubes 132 extending between a first manifold portion and an opposing second manifold portion. The plurality of condenser tubes 132 in the condenser assists in containing and transporting a liquid therethrough. The liquid in the plurality of condenser tubes 132 is configured to receive or absorb transferred heat from the coolant (vapor phase), as will be discussed below. The plurality of condenser tubes may be of various sizes and shapes. One non-limiting cross-sectional shape of the plurality of condenser tubes is a generally circular form. Another non-limiting cross-sectional shape of the plurality of condenser tubes is a general oval form.

It is contemplated that the plurality of tubes may be other shapes including polygonal shapes or other non-polygonal shapes. For example, the plurality of condenser tubes may have a cross-section being a polygonal shape (e.g., a square or a rectangle). It is, of course, desirable for the plurality of condenser tubes to be shaped and sized for effective heat transfer with the coolant (vapor phase).

The manifold system (not shown) is coupled to the condenser 130 to assist in distributing liquid flow to and from the plurality of condenser tubes. The first manifold portion (not shown) handles and distributes cold liquid (e.g., water), while the second manifold portion (not shown) handles and consolidates removal of the hot liquid (e.g., water). In one embodiment, the first manifold portion has at least one larger opening that is in fluid communication with cold liquid piping. The cold liquid piping contains cold liquid (e.g., water) that enters the at least one larger opening in the first manifold portion. The first manifold portion further includes a plurality of openings formed therein to receive and distribute the cold liquid to the plurality of condenser tubes 132 of the condenser 130.

The second manifold portion (not shown) has at least one larger opening that is in fluid communication with hot liquid piping. The hot liquid piping removes hot liquid (e.g., water) that enters the at least one larger opening in the second manifold portion. The second manifold portion further includes a plurality of openings formed therein that collects and consolidates the hot liquid from the plurality of condenser tubes 132 to be removed via the hot liquid piping. The hot liquid piping carries away the heat generated from the heat-generating components.

The immersion liquid cooling tank assembly 100 of FIGS. 1 and 2 includes exactly one condenser 130. It is contemplated that an immersion liquid cooling tank assembly may include a plurality of condensers, such as described below with respect to FIGS. 3 and 4. The number and size of the condensers would be dependent on the desired cooling capabilities of the immersion liquid cooling tank assembly. The desired cooling capabilities would depend on factors such as the number and size of the heat-generating components, the size of the immersion liquid cooling tank assembly, and the type and amount of coolant being used.

It is also contemplated that the condenser may be configured in a different manner than described above.

The immersion liquid cooling tank assembly 100 includes the cross-flow fan 140 and the internal wall system 150 to assist in the cooling of the heat-generating components. The internal wall system 150 is located adjacent to the cross-flow fan 140 as shown in FIGS. 1 and 2. The cross-flow fan 140 and the internal wall system 150 assist in directing and moving the coolant 202 in the tank 110 by forced convection in combination with the Coanda effect.

The Coanda effect is the tendency of a fluid jet to stay attached to a convex or curved surface. The airflow from the cross-flow fan 140 and the internal wall system 150 is shown by arrow A in FIGS. 1 and 2. The configuration of the tank 110 generates an airflow closed loop to contact the gaseous molecules and move them toward the condenser. This can force vapor to pass through the condenser 130, which condenses the vapor to liquid and exchanges heat to the liquid in the condenser. The condensed liquid can then drop to the bottom to be contacted with the heat-generating components to be vaporized again.

This configuration assists in cooling the heat-generating components, which can save power by maintaining the cooling loop. The use of forced convection more efficiently performs the heat exchange, which can make the maintenance of the immersion liquid cooling tank assembly 100 easier and more cost effective.

The airflow of a cross-flow fan depends on the width of the cross-flow fan. In one non-limiting example, a cross-flow fan has a width of 500 mm and an airflow of about 400 CFM. It is contemplated that the cross-flow fan may have different widths and also different airflow rates. Commercial cross-flow fans may be used, especially if there is no interference in the airflow.

Referring to FIGS. 1 and 2, the internal wall system 150 includes a plurality of walls. More specifically, the internal wall system 150 includes a rear wall 152 and a vortex wall 154. The internal wall system 150 assists in directing the airflow leaving the cross-flow fan 140 along a desired path (arrow A). It is contemplated that the internal wall system may be configured in a different manner than shown in FIGS. 1 and 2.

The immersion liquid cooling tank assembly 100 further includes the top cover 160. The top cover 160 assists in providing a closed environment or system for the immersion liquid cooling tank assembly 100. The top cover 160 is moveable or removable to gain access to the heat-generating components contained with the tank 110. To assist in moving the top cover in one embodiment, one or more hinges may be used. It is contemplated that other mechanisms besides hinges may be used to assist in gaining access to the plurality of heat-generating components in the tank.

It is contemplated that the top cover may be configured differently than shown in FIGS. 1 and 2 in other embodiments. For example, the top cover may be a continuous top cover in which at least one portion can be removed or moved to gain access to an interior of the tank. In another embodiment, the top cover may be a plurality of top covers.

The immersion liquid cooling tank assembly 100 further includes the sloping wall 170 being located between the top cover 160 and the plurality of sidewalls including sidewalls 114, 116. The sloping wall 170 assists in providing a closed airflow loop smoothed by the Coanda effect. The sloping wall provides a closed airflow loop for the airflow produced by the cross-flow fan 140.

The sloping wall 170 of FIG. 1 slopes inwardly at an angle A of from about 10 to about 80 as measured from the sidewall 114 in one embodiment. In another embodiment, the sloping wall 170 of FIG. 1 slopes inwardly at an angle A of from about 20 to about 70 as measured from the sidewall 114.

Referring back to FIG. 1, the immersion liquid cooling tank assembly 100 includes the coolant 202 and a plurality of heat-generating components 204, which are located and contained within the tank 110.

The coolant 202 may be selected from a variety of coolants to assist in removing heat generated from the plurality of heat-generating components 204 by directly contacting those components. In one embodiment, the coolant is a thermally-conductive, dielectric liquid coolant. The coolant 202 assists in removing heat generated from the heat-generating components 204 by directly contacting those components. The liquids to be used as the coolant typically have very good insulating properties so that contact with the heat-generated components can be accomplished in a safe manner. The coolant 202 changes between its liquid and vapor phases easily and at a desired temperature.

The type of coolant is selected based on the requirement of thermal design. Non-limiting examples of coolants include fluorocarbons, water (e.g., deionized water, mixtures including water, and hydrocarbons. It is contemplated that other coolants may be used that can remove and absorb heat from the heat-generating components stored within the tank.

The plurality of heat-generating components 204 shown in FIG. 1 is a plurality of servers. As discussed above, the top cover 160 may be removed or may be moved from a closed position to an open position by, for example, a hinge so as to gain access to the plurality of heat-generating components 204.

Non-limiting examples of heat-generating components 204 that may be contained within the immersion liquid cooling tank assembly 100 include, but are not limited to, storage servers, application servers, switches, or other electronic devices. Examples include, but are not limited to, CPU, DIMM, network card, a HDD, SSD, GPU or FPGA.

The plurality of heat-generating components 204 rests on a support structure 206 in one embodiment. The support structure 206 is configured to support and position the plurality of heat-generating components 204. The support structure may be angled to assist in positioning and removing the heat-generating components 204 from the immersion liquid cooling tank assembly 100.

The process of heat transfer is shown best in FIG. 1, in which the immersion liquid cooling tank assembly 100 is configured to be used in a two-phase immersion process. In this process, a two-phase temperature evaporation process cools the plurality of heat-generating components 204 via the coolant 202. The coolant 202 surrounds the plurality of heat-generating components 204. As the coolant 202 (liquid phase) contacts the heat-generating components 204, molecules of the coolant in the liquid phase become gaseous molecules of coolant and extends upwardly (directions of arrows B and C). As the gaseous molecules travel in the general direction of arrows B and C, the gaseous molecules contact the air flow of arrow A, which directs the gaseous molecules to the condenser 130. After contacting the condenser, the gaseous coolant molecules are transformed into liquid coolant molecules. The liquid coolant molecules then travel in the general direction of arrows D-F back into the coolant bath.

Figure 3:
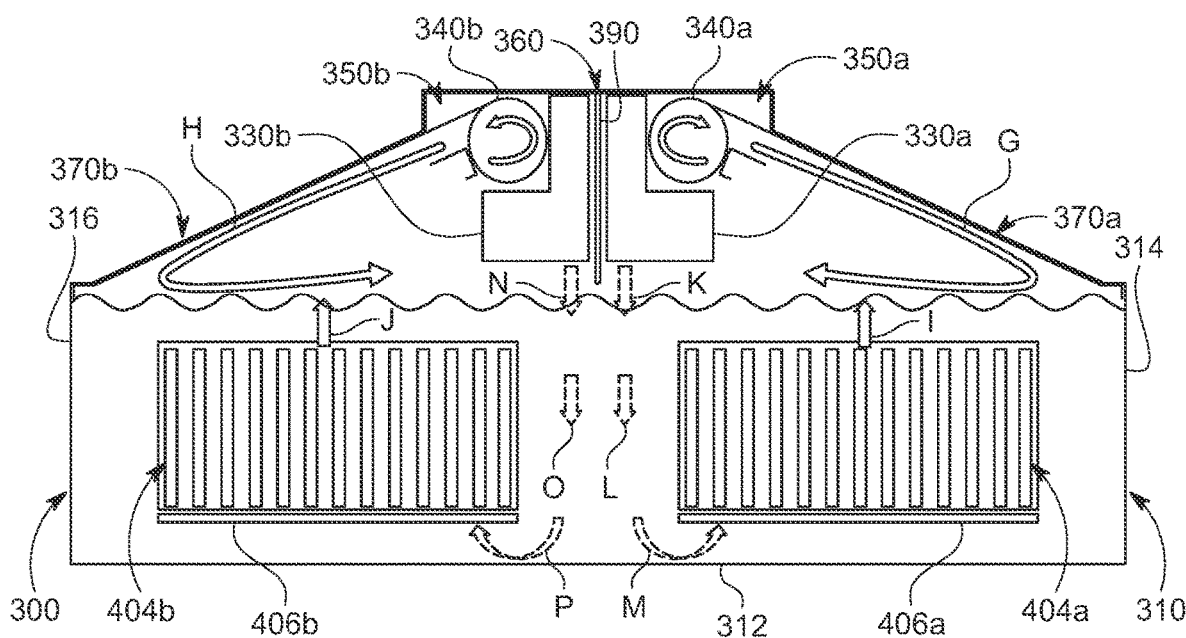
FIG. 3 is a semi-transparent, front view of an immersion liquid cooling tank assembly, in accordance with another embodiment of the present disclosure.
Figure 4:
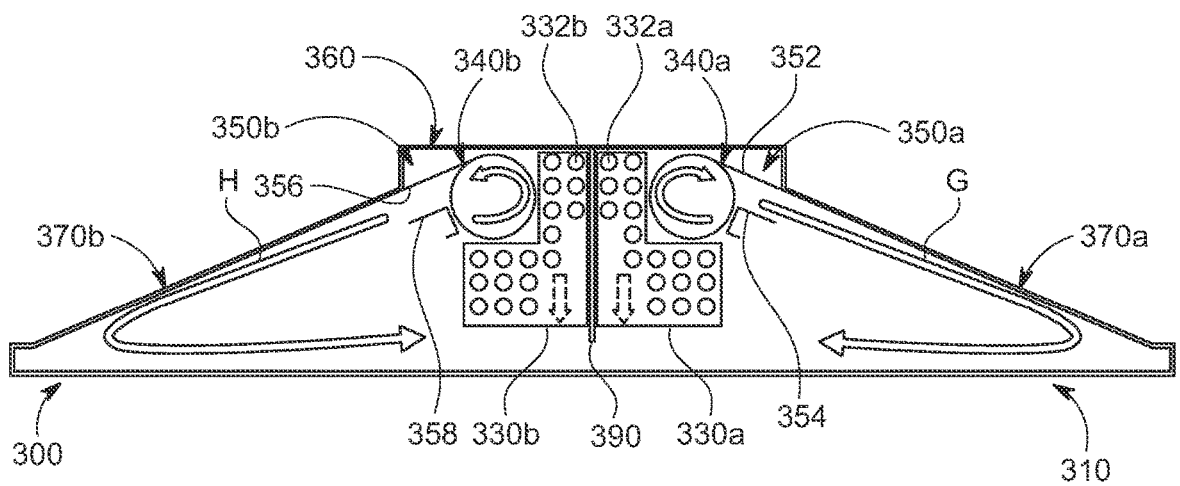
FIG. 4 is an enlarged semi-transparent, front view of a portion of the immersion liquid cooling tank assembly of FIG. 3.

Referring to FIGS. 3 and 4, an immersion liquid cooling tank assembly 300 includes a tank 310, a plurality of condensers 330a, 330b, a plurality of cross-flow fans 340a, 340b, internal wall systems 350a, 350b, a top cover 360 and sloping walls 370a, 370b. The tank 310 includes a base 312, and a plurality of sidewalls 314, 316. The other sidewalls of the immersion liquid cooling tank assembly 300 are not shown in FIGS. 3 and 4. The base 312 and the plurality of sidewalls including sidewalls 314, 316 are connected or attached with each other.

Referring still to FIG. 4, the immersion liquid cooling tank assembly 300 includes the condensers 330a, 330b with each having an internal network of fluid conduits. The fluid conduits used in the condensers 330a, 330b are in the form of condenser tubes 332a, 332b in one embodiment. The plurality of condenser tubes 332a, 332b used in the respective condensers 330a, 330b is desirable because of their efficiency in the cooling of the coolant from its vapor phase to its liquid phase. The condensers 330a, 330b may be configured in a similar manner as described above with respect to the condenser 130.

The immersion liquid cooling tank assembly 300 includes the plurality of cross-flow fans 340a, 340b and the internal wall systems 350a, 350b to assist in the cooling of the heat-generating components. The internal wall systems 350a, 350b are located near or adjacent to respective cross-flow fans 340a, 340b as shown in FIGS. 3 and 4. The cross-flow fans 340a, 340b and the internal wall systems 350a, 350b assist in directing and moving the coolant 202 in the tank 310 by forced convection in combination with the Coanda effect. The cross-flow fans 340a, 340b may be configured in a similar manner as described above with respect to the cross-flow fan 140.

The airflow from the cross-flow fans 340a, 340b and the internal wall system 350a, 350b are shown by arrows G and H in FIGS. 3 and 4. The configuration of the tank 310 generates an airflow closed loop on the liquid level. This can force vapor to pass through the condensers 330a, 330b, which condense the vapor to liquid and exchanges heat to the liquid in the condenser. The condensed liquid can then drop to the bottom to be contacted with the heat-generating components to be vaporized again.

This configuration assists in cooling the heat-generating components, which can save power by maintaining the cooling loop. The use of forced convection more efficiently performs the heat exchange, which can make the maintenance of the immersion liquid cooling tank assembly 300 easier and more cost effective.

Referring to FIG. 4, each of the internal wall systems 350a, 350b includes a plurality of walls. More specifically, the internal wall system 350a includes a rear wall 352 and a vortex wall 354, and the internal wall system 350b includes a rear wall 356 and a vortex wall 358. The internal wall system 350a assists in directing the liquid leaving the cross-flow fan 340a along a desired path (arrow G). The internal wall system 350b assists in directing the airflow leaving the cross-flow fan 340b along a desired path (arrow H). It is contemplated that the internal wall systems may be configured in a different manner than shown in FIG. 4.

The immersion liquid cooling tank assembly 300 further includes the top cover 360. The top cover 360 functions in a similar manner as described above with respect to the top cover 160. The immersion liquid cooling tank assembly 100 further includes the sloping walls 370a, 370b that are located between the top cover 360 and the respective sidewalls 314, 316. The sloping walls 370a, 370b assist in providing a closed airflow loop smoothed by the Coanda effect. The sloping walls 370a, 370b are similar to the above described sloping wall 170.

Referring back to FIG. 3, the immersion liquid cooling tank assembly 300 includes the coolant 202 and a plurality of heat-generating components 404a, 404b located and contained within the tank 310. The plurality of heat-generating components 404a, 404b are similar to that described above with respect to the plurality of heat-generating components 204. The plurality of heat-generating components 404a, 404b rests on respective support structures 406a, 406b in one embodiment. The support structures 406a, 406b are similar to that described above with respect to the support structure 206.

The process of heat transfer is shown best in FIG. 3, in which the immersion liquid cooling tank assembly 300 is configured to be used in a two-phase immersion process. In this process, a two-phase temperature evaporation process cools the plurality of heat-generating components 404a, 404b via the coolant 202. The coolant 202 surrounds the plurality of heat-generating components 404a, 404b. As the coolant 202 (liquid phase) contacts the plurality of heat-generating components 404a, 404b, molecules of the coolant in the liquid phase become gaseous molecules of coolant and extends upwardly (directions of arrows I and J). As the gaseous molecules travel in the general direction of arrow I, the gaseous molecules contact the air flow of arrow G, which directs the gaseous molecules to the condenser 330a. As the gaseous molecules travel in the general direction of arrow J, the gaseous molecules contact the air flow of arrow H, which directs the gaseous molecules to the condenser 330b. After contacting the respective condensers 330a, 330b, the gaseous coolant molecules are transformed into liquid coolant molecules. The liquid coolant molecules then travel in the general direction of arrows K-M or N-P back to the coolant bath.

The immersion liquid cooling tank assembly 300 further includes a partition 390 located between the plurality of cross-flow fans 340a, 340b. The partition 390 assists in minimizing the impact of the cross-flow fans 340a, 340b with each other. In other words, the partition 390 assists in keeping the airflow from each of the cross-flow fans 340a, 340b separate and distinct from each other. This assists in maintaining the desired direction and rate of the airflow from the cross-flow fans 340a, 340b.

The tank 310 of FIGS. 3 and 4 is shaped differently than the tank 110 of FIGS. 1 and 2. The tank 310, however, functions in a similar manner as the tank 110.

The tank 110 or 310 comprises a metallic material. Non-limiting metallic materials that may be used in forming the tank include steel. Examples of steel that may be used in forming the tank include, but are not limited to, stainless steel, and cold-rolled steel such as SGCC steel. It is contemplated that other materials besides metallic material may be used in forming the generally elliptical tank, if such materials have the desired properties including strength to hold the material inside. The support structures 406a, 406b may be formed using the same material as the material used in forming the tanks 110 and 310.

In further embodiments, the least one sidewall, instead of the at least one sloping wall, may provide a closed airflow loop for the airflow produced by the at least one cross-flow fan. In other words, instead of having a sloping wall between the top cover and the sidewall, the top cover would be directly connected to the at least one sidewall in the absence of a sloping wall. The sidewall may extend generally perpendicular or perpendicular from the top cover and provide a closed airflow loop for the airflow produced by the at least one cross-flow fan.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An immersion liquid cooling tank assembly comprising:
    a tank including a base and at least one sidewall, the base connected to the at least one sidewall;
    a condenser located within the tank, the condenser adapted to transform vapor into liquid;
    at least one cross-flow fan near the condenser, the at least one cross-flow fan producing an airflow;
    an internal wall system located adjacent to the at least one cross-flow fan to assist in directing the airflow from the cross-flow fan;
    a top cover located opposite to the base; and
    at least one sloping wall located between the top cover and the least one sidewall, the at least one sloping wall providing a closed airflow loop for the airflow produced by the at least one cross-flow fan,
    wherein the at least one cross-flow fan is located near the top cover and the condenser is located near the top cover, the condenser being configured to receive the airflow from the closed airflow loop.

2. The assembly of claim 1, wherein the at least one sidewall is a plurality of sidewalls.

3. The assembly of claim 1, wherein the at least one cross-flow fan is a plurality of cross-flow fans.

4. The assembly of claim 3, further including a partition located between the plurality of cross-flow fans.

5. The assembly of claim 1, wherein the internal wall system includes a plurality of walls.

6. The assembly of claim 1 further including a coolant located and contained within the tank.

7. The assembly of claim 6, wherein the coolant is a fluorocarbon.

8. The assembly of claim 6, wherein the coolant is water or a mixture including water.

9. The assembly of claim 1 further including a plurality of heat-generating components contained within the tank.

10. The assembly of claim 9, wherein the plurality of heat-generating components includes storage servers, application servers, switches, or other electronic devices.

11. The assembly of claim 1, wherein the at least one sloping wall slopes inwardly at an angle of from 10 to 80 degrees as measured from the base, the at least one sidewall being a plurality of sidewalls, the at least one sloping wall being located between two of the plurality of sidewalls.

12. The assembly of claim 11, wherein the at least one sloping wall slopes inwardly at an angle of from 20 to 70 degrees as measured from the base, the at least one sidewall being a plurality of sidewalls, the at least one sloping wall being located between two of the plurality of sidewalls.

13. An immersion liquid cooling tank assembly comprising:
    a tank including a base and at least one sidewall, the base connected to the at least one sidewall, the base being generally perpendicular to the at least one sidewall;
    a condenser located within the tank;
    at least one cross-flow fan;
    an internal wall system located adjacent to the at least one cross-flow fan to assist in directing the airflow from the at least one cross-flow fan;
    a top cover located opposite to the base;
    at least one sloping wall connecting the top cover and the least one sidewall, the at least one sloping wall being generally diagonal relative to the top cover and the at least one sidewall;
    a coolant contained within the tank; and
    a plurality of heat-generating components contained within the tank, wherein the at least one cross-flow fan is located near the top cover and the condenser is located near the top cover, the condenser being configured to receive the airflow from a closed airflow loop for the airflow that is produced by the at least one cross-flow fan.

14. The assembly of claim 13, wherein the coolant is a fluorocarbon.

15. The assembly of claim 13, wherein the coolant is water or a mixture including water.

16. The assembly of claim 13, wherein the plurality of heat-generating components includes one or more of: storage servers, application servers, switches, and other electronic devices.

17. The assembly of claim 13, wherein the at least one sloping wall slopes inwardly at an angle of from 10 to 80 degrees as measured from the base, the at least one sidewall being a plurality of sidewalls, the at least one sloping wall being located between two of the plurality of sidewalls.

18. The assembly of claim 17, wherein the at least one sloping wall slopes inwardly at an angle of from 20 to 70 degrees as measured from the base, the at least one sidewall being a plurality of sidewalls, the at least one sloping wall being located between two of the plurality of sidewalls.

19. The assembly of claim 13, wherein the internal wall system includes a plurality of walls.

* * * * *